United States Patent
Inaoka

(10) Patent No.: US 10,233,413 B2
(45) Date of Patent: Mar. 19, 2019

(54) CLEANING FORMULATIONS

(71) Applicant: Air Products and Chemicals, Inc., Allentown, PA (US)

(72) Inventor: Seiji Inaoka, Macungie, PA (US)

(73) Assignee: VERSUM MATERIALS US, LLC, Tempe, AZ (US)

(*) Notice: Subject to any disclaimer, the term of this patent is extended or adjusted under 35 U.S.C. 154(b) by 0 days.

(21) Appl. No.: 15/264,078

(22) Filed: Sep. 13, 2016

(65) Prior Publication Data

US 2017/0081622 A1 Mar. 23, 2017

Related U.S. Application Data

(60) Provisional application No. 62/222,259, filed on Sep. 23, 2015.

(51) Int. Cl.

| | | |
|---|---|---|
| *C11D 3/00* | (2006.01) | |
| *C11D 7/00* | (2006.01) | |
| *C11D 11/00* | (2006.01) | |
| *H01L 21/02* | (2006.01) | |
| *C11D 7/26* | (2006.01) | |
| *C11D 7/32* | (2006.01) | |
| *C11D 7/50* | (2006.01) | |

(52) U.S. Cl.
CPC .......... *C11D 11/0047* (2013.01); *C11D 7/265* (2013.01); *C11D 7/3209* (2013.01); *C11D 7/3245* (2013.01); *C11D 7/50* (2013.01); *H01L 21/02068* (2013.01)

(58) Field of Classification Search
CPC .. C11D 3/24; C11D 3/245; C11D 3/30; C11D 11/0029; C11D 11/0047
See application file for complete search history.

(56) References Cited

U.S. PATENT DOCUMENTS

| | | | |
|---|---|---|---|
| 7,960,328 B2* | 6/2011 | Visintin | H01L 21/02079 134/1.3 |
| 8,846,533 B2 | 9/2014 | Ishibashi | |
| 2003/0181342 A1 | 9/2003 | Seijo et al. | |
| 2009/0099051 A1 | 4/2009 | Aoyama et al. | |
| 2010/0035785 A1 | 2/2010 | Wojtczak et al. | |
| 2013/0069234 A1 | 3/2013 | Lee et al. | |
| 2013/0217234 A1 | 8/2013 | Liu et al. | |
| 2014/0109931 A1* | 4/2014 | Lee | C11D 7/10 134/3 |
| 2016/0010035 A1* | 1/2016 | Liu | C11D 3/30 510/175 |

FOREIGN PATENT DOCUMENTS

| | | |
|---|---|---|
| CN | 102533470 A | 7/2012 |
| WO | 03/083582 A1 | 10/2003 |
| WO | 2008/144501 A2 | 11/2008 |

* cited by examiner

*Primary Examiner* — Haidung D Nguyen
(74) *Attorney, Agent, or Firm* — Anne B. Kiernan

(57) ABSTRACT

A composition useful for removing residue from a semiconductor substrate comprising in effective cleaning amounts: from about 55 to 80% by weight of water; from about 0.3 to about 5.0% by weight of EDTA; from about 10.0 to about 30.0% by weight of an amine compound wherein the amine compound is selected from the group consisting of a secondary amine, a tertiary amine, and mixtures thereof; from about 0.1 to about 5.0% by weight of a polyfunctional organic acid; from about 0.01 to about 8.0% by weight of a fluoride ion source; from about 0 to about 60% by weight of a water-miscible organic solvent; and from about 0 to about 15% by weight of a corrosion inhibitor.

25 Claims, No Drawings

CLEANING FORMULATIONS

CROSS REFERENCE TO RELATED PATENT APPLICATIONS

The present patent application claims the benefit of U.S. Provisional Patent Application Ser. No. 62/222,259 filed Sep. 23, 2015 which is hereby incorporated by reference.

BACKGROUND

The present invention provides cleaning compositions that can be used for a variety of applications including, for example, removing unwanted resist films, post-etch, and post-ash residue on a semiconductor substrate. In particular, the present invention provides cleaning compositions that are particularly useful for back-end-of-the-line operations that minimize the use of organic components.

The background of the present invention will be described in connection with its use in cleaning applications involving the manufacture of integrated circuits. It should be understood, however, that the use of the present invention has wider applicability as described hereinafter.

In the manufacture of integrated circuits, it is sometimes necessary to etch openings or other geometries in a thin film deposited or grown on the surface of silicon, gallium arsenide, glass, or other substrate located on an in-process integrated circuit wafer. Present methods for etching such a film require that the film be exposed to a chemical etching agent to remove portions of the film. The particular etching agent used to remove the portions of the film depends upon the nature of the film. In the case of an oxide film, for example, the etching agent may be hydrofluoric acid. In the case of a polysilicon film, it will typically be hydrofluoric acid or a mixture of nitric acid and acetic acid.

In order to assure that only desired portions of the film are removed, a photolithography process is used, through which a pattern in a computer drafted photo mask is transferred to the surface of the film. The mask serves to identify the areas of the film which are to be selectively removed. This pattern is formed with a photoresist material, which is a light sensitive material spun onto the in-process integrated circuit wafer in a thin film and exposed to high intensity radiation projected through the photo mask. The exposed or unexposed photoresist material, depending on its composition, is typically dissolved with developers, leaving a pattern which allows etching to take place in the selected areas, while preventing etching in other areas. Positive-type resists, for example, have been extensively used as masking materials to delineate patterns on a substrate that, when etching occurs, will become vias, trenches, contact holes, etc.

Increasingly, a dry etching process such as, for example, plasma etching, reactive ion etching, or ion milling is used to attack the photoresist-unprotected area of the substrate to form the vias, trenches, contact holes, etc. As a result of the plasma etching process, photoresist, etching gas and etched material by-products are deposited as residues around or on the sidewall of the etched openings on the substrate.

Such dry etching processes also typically render the photoresist extremely difficult to remove. For example, in complex semiconductor devices such as advanced DRAMS and logic devices with multiple layers of back end lines of interconnect wiring, reactive ion etching (RIE) is used to produce vias through the interlayer dielectric to provide contact between one level of silicon, silicide or metal wiring to the next level of wiring. These vias typically expose, Al, AlCu, Cu, Ti, TiN, Ta, TaN, silicon or a silicide such as, for example, a silicide of tungsten, titanium or cobalt. The RIE process leaves a residue on the involved substrate comprising a complex mixture that may include, for example, re-sputtered oxide material, polymeric material derived from the etch gas, and organic material from the resist used to delineate the vias.

Additionally, following the termination of the etching step, the photoresist and etch residues must be removed from the protected area of the wafer so that the final finishing operation can take place. This can be accomplished in a plasma "ashing" step by the use of suitable plasma ashing gases. This typically occurs at high temperatures, for example, above 200° C. Ashing converts most of the organic residues to volatile species, but leaves behind on the substrate a predominantly inorganic residue. Such residue typically remains not only on the surface of the substrate, but also on inside walls of vias that may be present. As a result, ash-treated substrates are often treated with a cleaning composition typically referred to as a "liquid stripping composition" to remove the highly adherent residue from the substrate. Finding a suitable cleaning composition for removal of this residue without adversely affecting, e.g., corroding, dissolving or dulling, the metal circuitry has also proven problematic. Failure to completely remove or neutralize the residue can result in discontinuances in the circuitry wiring and undesirable increases in electrical resistance.

With the advancement of device technology and smaller feature dimensions that are necessitated by the technology advancement, metals for device often change. For example, copper (Cu) has become the standard material for use as a conductor and for layers such as hard masks or diffusion barrier layers, new metals are being incorporated into the structure. One such metal is cobalt (Co). The use of cobalt presents challenges in that the corrosion characteristics of cobalt are similar to that of copper, but cobalt is less noble than copper and tends to be corroded more easily than copper.

Therefore, there is a need in the art for a cleaning composition that is non-toxic and environmentally friendly for back-end cleaning operations including stripping photoresist and plasma ash residue such as, for example, those generated by plasma processes without suffering from the above-identified drawbacks. There is a particular need in the art for a cleaning composition for use in the manufacture of semiconductors that has good corrosion protection capability for copper and other metals such as cobalt that has a cleaning efficiency comparable to conventional high organic content based cleaning compositions that removes etch residues while not changing the critical dimensions of the metal structures on the substrate.

SUMMARY

In one aspect, the present disclosure provides a composition useful for removing residue from a semiconductor substrate comprising in effective cleaning amounts: from about 55 to 80% by weight of water; from about 0.3 to about 5.0% by weight of EDTA; from about 10.0 to about 30.0% by weight of an amine compound wherein the amine compound is selected from the group consisting of a secondary amine, a tertiary amine, and mixtures thereof; from about 0.1 to about 5.0% by weight of a polyfunctional organic acid; from about 0.01 to about 8.0% by weight of a fluoride ion source; from about 0 to about 60% by weight of a water-miscible organic solvent; and from about 0 to about 15% by weight of a corrosion inhibitor.

In another aspect, the present disclosure provides a method for removing residue from a substrate optionally comprising aluminum, the method comprising the steps of: from about 55 to 80% by weight of water; from about 0.3 to about 5.0% by weight of EDTA; from about 10.0 to about 30.0% by weight of an amine compound wherein the amine compound is selected from the group consisting of a secondary amine, a tertiary amine, and mixtures thereof; from about 0.1 to about 5.0% by weight of a polyfunctional organic acid; from about 0.01 to about 8.0% by weight of a fluoride ion source; from about 0 to about 60% by weight of a water-miscible organic solvent; and from about 0 to about 15% by weight of a corrosion inhibitor; rinsing the substrate with water; and drying the substrate, optionally wherein the method excludes an intermediate IPA rinse step prior to the step of rinsing the substrate with water.

DETAILED DESCRIPTION

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

As used herein and in the claims, the terms "comprising," "comprises," "including," and "includes" are inclusive or open-ended and do not exclude additional unrecited elements, composition components, or method steps. Accordingly, these terms encompass the more restrictive terms "consisting essentially of" and "consisting of." Unless specified otherwise, all values provided herein include up to and including the endpoints given, and the values of the constituents or components of the compositions are expressed in weight percent of each ingredient in the composition.

The present invention provides a composition whose components are present in amounts that effectively remove residue from a substrate such as, for example, a semiconductor substrate. In applications concerning semiconductor substrates, such residues include, for example, photoresist residues, ash residues, and etch residues such as, for example, residues caused by reactive ion etching. Moreover, a semiconductor substrate also includes metal, silicon, silicate and/or inter-level dielectric material such as deposited silicon oxides, which will also come into contact with the cleaning composition. Typical metals include copper, copper alloy, cobalt, and other metals such as, for example, tungsten, titanium, tantalum, and aluminum. The cleaning composition of the present invention is compatible with such materials as they exhibit a low metal and/or dielectric etch rate. In particular, the cleaning compositions of the present disclosure providing a copper and cobalt etch rate of 4 Å/min or less, 3 Å/min or less, or 2 Å/min or less may be preferred.

The cleaning compositions of the present invention comprise, consist essentially of or consist of: from about 55 to 80% by weight of water; from about 0.3 to about 5.0% by weight of EDTA; from about 10.0 to about 30.0% by weight of an amine compound wherein the amine compound is selected from the group consisting of a secondary amine, a tertiary amine, and mixtures thereof; from about 0.1 to about 5.0% by weight of a polyfunctional organic acid; from about 0.01 to about 8.0% by weight of a fluoride ion source; from about 0 to about 60% by weight of a water-miscible organic solvent; and from about 0 to about 15% by weight of a corrosion inhibitor. The role of each component will be explained below in greater detail.

All weight percents of the components detailed herein are based on the amount of the active of the component as opposed to, for example, the weight of an aqueous solution of the component.

Water

The cleaning compositions of the present invention are aqueous-based and, thus, comprise water as the largest component in terms of weight percent of a composition. In the present invention, water functions in various ways such as, for example, to dissolve one or more solid components of the composition, as a carrier of the components, as an aid to facilitate the removal of inorganic salts and complexes, as a viscosity modifier of the composition, and as a diluent. Preferably, the water employed in the cleaning composition is de-ionized (DI) water.

It is believed that, for most applications, water will comprise, for example, from about 55 to about 80% by wt. of the cleaning composition. Other preferred embodiments of the present invention could comprise from about 60 to about 80% by wt. of water. Yet other preferred embodiments of the present invention could comprise from about 60 to about 70% by wt. of water. Such compositions having a large percentage of water are also referred to herein as "water-rich compositions." Still other preferred embodiments of the present invention could include water in an amount to achieve the desired weight percent of the other ingredients.

EDTA

The cleaning composition of the present disclosure comprises ethylenediaminetetraacetic acid (EDTA), which functions primarily to protect cobalt metal (when present) from corrosion. Without intending to be bound by any particular theory, it is believed that the EDTA binds to the surface of the metal and hinders access by other corroding agents thereby protecting the metal.

It is believed that, for most applications, the amount of the EDTA will comprise from about 0.3 to about 5% by weight of the composition. Preferably the EDTA comprises from about 0.3 to about 3.5% by weight and, most preferably, from about 0.3% to about 2% by weight of the composition.

Amine Compound (Buffer)

The cleaning composition of the present disclosure also comprises a secondary or tertiary organic amine. The secondary or tertiary organic amine functions primarily to provide the conjugate base component of the buffer but also, to the extent there is excess of what is needed for the buffer, functions as a cleaning component as it can react with organic residue and chelate metals during the cleaning operation.

Examples of secondary or tertiary organic amine compounds for use as a buffer component in certain preferred embodiments of the present disclosure, include the alkanolamines. Preferred alkanolamines include the lower alkanolamines which are secondary and/or tertiary having from 1 to 5 carbon atoms. Examples of such alkanolamines include diethanolamine, di- and triisopropanolamine, 2-(2-aminoethylamino)ethanol, 2-(2-aminoethoxy)ethanol, triethanolamine, N-ethyl ethanolamine, N,N-dimethylethanolamine, N,N-diethyl ethanolamine, N-methyl diethanolamine, N-ethyl diethanolamine, cyclohexylaminediethanol, and mixtures thereof.

In preferred embodiments, the amine compound is an alkanolamine selected from the group consisting of triethanolamine (TEA), diethanolamine, N-methyl diethanolamine, diisopropanolamine, N-methyl ethanol amine, and mixtures thereof.

It is believed that the amount of the amine compound in the composition will, for the most applications, comprise from about 10% to about 30% by weight of the composition, specifically, about 20% to about 30% by weight of the composition.

Preferably, the amine compound has a pKa<9.0.

Polyfunctional Organic Acid (Buffer Component)

The cleaning composition of the present disclosure also comprises one or more polyfunctional organic acids, which function primarily as the conjugate acid portion of the buffer. As used herein, the term "polyfunctional organic acid" refers to an acid or a multi-acid that has more than one carboxylate group, including but not limited to, (i) dicarboxylate acids (such as malonic acid, malic acid, et al); dicarboxylic acids with aromatic moieties (such as phthalic acid et al), and combinations thereof; and (ii) tricarboxylic acids (such as citric acid et al), tricarboxylic acids with aromatic moieties (such as trimellitic acid, et al), and combinations thereof.

It is believed that the amount of polyfunctional organic acid in the compositions of the present disclosure will be from about 0.1 wt % to 5 wt %, preferably from 0.25 wt % to 3 wt %, and more preferably from 0.5 wt % to 2.0 wt %.

For purposes of the present disclosure, the polyfunctional organic acid is a separate component from the EDTA component, which is also a polyfunctional organic acid.

Preferably, the polyfunctional organic acid and the amine compound are mixed in a ratio that will achieve a pH of from 7 to 9.

Fluoride Ion Source

The cleaning composition of the present disclosure also comprises one or more sources of fluoride ion. Fluoride ion functions principally to assist in removing inorganic residues from the substrate. Preferred compounds that provide a fluoride ion source according to the present invention are ammonium fluoride and quaternary ammonium fluorides such as, for example, tetramethylammonium fluoride and tetrabutylammonium fluoride. A fluoride salt of an aliphatic primary, secondary or tertiary amine can be used. Examples of such amines are those having the formula:

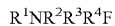

wherein $R^1$, $R^2$, $R^3$ and $R^4$ individually represent H or a ($C_1$-$C_4$) alkyl group. Typically, the total number of carbon atoms in the $R^1$, $R^2$, $R^3$ and $R^4$ groups is 12 carbon atoms or less.

In selecting the source of the fluoride ion, consideration should be given as to whether or not the source releases ions that would adversely affect the surface being cleaned. For example, in cleaning semiconductor elements, the presence of sodium or calcium ions in the cleaning composition can have an adverse effect on the surface of the element. In a preferred embodiment, the fluoride ion source is ammonium fluoride.

It is believed that the amount of the compound used as the source of the fluoride ion in the cleaning composition will, for most applications, comprise, about 0.01 to about 8% by weight or from about 0.01 to about 7% by weight of a solution 40% ammonium fluoride, or stoichiometric equivalent thereof. Preferably, the compound comprises from about 0.02 to about 8% by weight, more preferably from about 0.02 to about 6% by weight, still more preferably, about 1 to about 8% by weight, and most preferably, from about 0.025% to about 5% by weight of a solution of about 40% ammonium fluoride. In some embodiments, the composition will comprise about 0.01 to about 8% by weight or about 0.01 to about 7% by weight of a fluoride ion source, which may be provided by a 40% ammonium fluoride solution. Preferably, the compound comprises from about 0.02 to about 6% by weight of a fluoride ion source and, most preferably, from about 0.025% to about 5% or from about 0.04 to about 2.5% by weight of a fluoride ion source or from about 0.05 to about 15% by weight of a solution of 40% ammonium fluoride, most preferably, from about 0.0625% to about 12.5% or from about 0.1 to about 6.25% by weight of a solution of 40% ammonium fluoride. It should be understood that the amount of fluoride ion used will typically depend, however, on the particular substrate being cleaned. For example, in certain cleaning applications, the amount of the fluoride ion can be relatively high when cleaning substrates that comprise dielectric materials that have a high resistance to fluoride etching. Conversely, in other applications, the amount of fluoride ion should be relatively low, for example, when cleaning substrates that comprise dielectric materials that have a low resistance to fluoride etching.

Solvent (Optional)

The compositions according to the present disclosure optionally comprises at least one organic solvent. The organic solvent is preferably miscible with water. In various embodiments of the present invention, metal lines on the substrate typically dictate whether a water-miscible organic solvent is used. For example, when aluminum lines are present on a substrate, the combination of water and halide ion will typically tend to etch the aluminum. In such embodiments, the use of water-miscible organic solvent can significantly reduce, if not eliminate, etching of aluminum.

Examples of water-miscible organic solvents include, but are not limited to, dimethylacetamide (DMAC), N-methyl pyrrolidinone (NMP), dimethylsulfoxide (DMSO), dimethylformamide, N-methylformamide, formamide, dimethyl-2-piperidone (DMPD), tetrahydrofurfuryl alcohol, glycerol, ethylene glycol, and other amides, alcohols or sulfoxides, or multifunctional compounds, such as hydroxyamides or amino alcohols. Further examples of the water-miscible organic solvents include diols and polyols such as ($C_2$-$C_{20}$) alkanediols and ($C_3$-$C_{20}$) alkanetriols, cyclic alcohols and substituted alcohols. Particular examples of these water-miscible organic solvents include propylene glycol, tetrahydrofurfuryl alcohol, diacetone alcohol and 1,4-cyclohexanedimethanol. In certain embodiments, the water-miscible organic solvent may be DMSO, NMP, and/or DMAC. The water-miscible organic solvents enumerated above may be used alone or in combination with two or more solvents.

In certain preferred embodiments of the present invention, the water-miscible organic solvent may comprise a glycol ether. Examples of glycol ethers include ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monoethyl ether acetate, propylene glycol methyl ether acetate, propylene glycol monomethyl ether, propylene glycol dimethyl ether, propylene glycol monobutyl ether, propylene glycol, monopropyl ether, dipropylene glycol monomethyl ether, dipropylene glycol monopropyl ether, dipropylene glycol monoisopropyl ether, dipropylene monobutyl ether, dipropylene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy) ethanol.

It is believed that, for most applications, the amount of water-miscible organic solvent will comprise from about 0% to about 60% by weight of the composition. Preferably, when employed, the water-miscible solvent comprises from about 20 to about 40% by weight of the composition.

Additional Corrosion Inhibitors (Optional)

The compositions of the present disclosure optionally comprise at least one corrosion inhibitor. Corrosion inhibitors serve to react with the substrate surface being cleaned, which may be a metal, particularly copper, or a nonmetal, to passivate the surface and prevent excessive etching during cleaning. In particular and without being bound to any particular theory, it is believed that the corrosion inhibitor forms a coating of an insoluble chelate compound on the copper surface (or other metal surface), thus suppressing contact between the photoresist residue removal component and the metal thereby preventing corrosion.

Any corrosion inhibitor known in the art for similar applications, such as those disclosed in U.S. Pat. No. 5,417,877, which are incorporated herein by reference, may be used. The use of a corrosion-inhibitor is particularly preferred when the composition is used to clean a metallic substrate. Examples of corrosion-inhibitors include aromatic hydroxyl compounds, acetylenic alcohols, carboxyl group-containing organic compounds and anhydrides thereof, and triazole compounds.

Exemplary aromatic hydroxyl compounds include phenol, cresol, xylenol, pyrocatechol, resorcinol, hydroquinone, pyrogallol, 1.2.4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, amino resorcinol, p-hydroxybenzoic acid, o-hydroxybenzoic acid, 2,4-dihydroxybenzoic acid, 2-5-dihydroxybenzoic acid, 3,4-dihydroxybenzoic acid and 3,5-dihydroxybenzoic acid.

Exemplary acetylenic alcohols include 2-butyne-1,4-diol, 3,5-dimethyl-1-hexyn-3-ol, 2-methyl-3-butyn-2-ol, 3-methyl-1-pentyn-3-ol, 3,6-dimethyl-4-octyn-3,6-diol, 2,4-7,9-tetramethyl-5-decyne-4,7-diol and 2,5-dimethyl-3-hexyne 2,5-diol.

Exemplary carboxyl group-containing organic compounds and anhydrides thereof include formic acid, acetic acid, propionic acid, butyric acid, isobutyric acid, benzoic acid, glycolic acid, lactic acid, acetic anhydride and salicylic acid.

Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

In an exemplary embodiment, the corrosion inhibitors include one or more of benzotriazole, carboxybenzotriazole, amino-benzotriazole, D-fructose, catechol, t-butyl catechol, L-ascorbic acid, gallic acid, vanillin, salicylic acid, diethyl hydroxylamine, and poly(ethyleneimine).

Preferred copper corrosion inhibitors are selected from the group consisting of benzotriazole, amino-benzotriazole, L-ascorbic acid, gallic acid, vanillin, diethylhydroxylamine, and mixtures thereof.

In other embodiments, the corrosion inhibitor is a triazole and is at least one of benzotriazole, o-tolyltriazole, m-tolyltriazole, and p-tolyltriazole. In other embodiments, the triazole compound is selected from the group consisting of o-tolyltriazole, m-tolyltriazole, p-tolyltriazole, and mixtures thereof.

It is believed that for most applications, the corrosion-inhibitor will comprise from about 0 wt. % to about 15 wt. % of the composition; preferably it comprises from about 0.1 wt. % to about 10 wt. %, preferably, from about 0.5 wt. % to about 5 wt. %, and most preferably, from about 0.1 wt. % to about 1 wt. % or about 0.5 wt. % to about 5 wt. % of the composition.

When the corrosion inhibitor is a triazole compound selected from the group consisting of o-tolyltriazole, m-tolyltriazole, p-tolyltriazole, and mixtures thereof, it is preferred that the triazole is present in an amount of from 0.3 to about 1.5% by weight of the cleaning composition.

In some embodiments, the compositions of the present disclosure are free of metal ions.

In other embodiments, the compositions of the present disclosure are free of ammonium salts of sulfuric esters.

Other Optional Ingredients

The cleaning composition of the present invention may also include one or more of the following additives: surfactants, chelating agents, chemical modifiers, dyes, biocides, and other additives. The additive(s) may be added to the extent that they do not adversely affect the pH range of the composition.

Another optional ingredient that can be used in the cleaning composition is a metal chelating agent (other than EDTA); it can function to increase the capacity of the composition to retain metals in solution and to enhance the dissolution of metallic residues. Typical examples of chelating agents useful for this purpose are the following organic acids and their isomers and salts: butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N, N,N',N'-ethylenediaminetetra (methylenephosphonic) acid (EDTMP), triethylenetetraminehexaacetic acid (TTNA), 1,3-diamino-2-hydroxypropane-N,N,N',N'-tetraacetic acid (DHPTA), methyliminodiacetic acid, propylenediaminetetraacetic acid, nitrotriacetic acid (NTA), tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine. Preferred chelating agents are aminocarboxylic acids such as CyDTA and aminophosphonic acids such as EDTMP.

It is believed that, for most applications, the chelating agent will be present in the composition in an amount of from about 0.1 wt. % to about 10 wt. %, preferably in an amount of from about 0.5 wt. % to about 5 wt. % of the composition.

Other commonly known components such as dyes, biocides etc. can be included in the cleaning composition in conventional amounts, for example, amounts up to a total of about 5 weight % of the composition.

The cleaning composition of the present invention is typically prepared by mixing the components together in a vessel at room temperature until all solids have dissolved in the aqueous-based medium.

The cleaning composition of the present invention can be used to remove from a substrate undesired residue. It is believed that the composition can be used to particularly good advantage in cleaning a semiconductor substrate on which residue is deposited or formed during the process for manufacturing semiconductor devices; examples of such residue include resist compositions in the form of films (both positive and negative) and etching deposits formed during dry etching, as well as chemically degraded resist films. The use of the composition is particularly effective when the residue to be removed is a resist film and/or an etching deposit on a semiconductor substrate having a metal film-exposed surface. Examples of substrates that can be cleaned by use of the composition of the present invention without attacking the substrates themselves include metal substrates, for example: aluminum titanium/tungsten; aluminum/silicon; aluminum/silicon/copper; silicon oxide; silicon nitride; and gallium/arsenide. Such substrates typically include residues comprising photoresists and/or post etch deposits.

Examples of resist compositions that can be effectively removed by use of the cleaning composition of the present invention include photoresists containing esters or ortho-naphthoquinones and novolak-type binders and chemically amplified resists containing blocked polyhydroxystyrene or copolymers of polyhydroxystyrene and photoacid generators. Examples of commercially available photoresist compositions include Clariant Corporation AZ 1518, AZ 4620, Shipley Company, Inc. photoresists, S1400, APEX-E™ positive DUV, UV5™ positive DUV, Megaposit™ SPR™ 220 Series; JSR Microelectronics photoresists KRF® Series, ARF® Series; and Tokyo Ohka Kogyo Co., Ltd. Photoresists TSCR Series and TDUR-P/N Series.

In addition to being effective when used to remove resist films and/or etching residues on a semiconductor wafer having an exposed surface of a metal film, the cleaning composition is especially effective when the metal film is made of copper or a copper alloy containing copper as the main component and also when a low-dielectric film is used as an interlayer insulating film. An example of a copper alloy containing copper as the main component is one containing 90% by weight or more copper, and other elements, for example, Sn, Ag, Mg, Ni, Co, Ti, Si, and Al. Since these metals have low resistances and improve the high-speed operation of elements, but are easily dissolved or corroded by chemicals, the "non-corrosive" properties of the composition of the present invention are significant.

The cleaning composition of the present disclosure can be used to remove post-etch and ash, other organic and inorganic residues as well as polymeric residues from semiconductor substrates at relatively low temperatures with little corrosive effect. The cleaning composition should be applied to the surface for a period of time to sufficient to obtain the desired cleaning effect. The time will vary depending on numerous factors, including, for example, the nature of the residue the temperature of the cleaning composition and the particular cleaning composition used. In general, the cleaning composition can be used, for example, by contacting the substrate at a temperature of from about 25° C. to about 85° C. for a period of time ranging from about 1 minute to about 1 hour followed by rinsing the cleaning composition from the substrate and drying the substrate.

The contacting step can be carried out by any suitable means such as, for example, immersion, spray, or via a single wafer process; any method that utilizes a liquid for removal of photoresist, ash or etch deposits and/or contaminants can be used.

The rinsing step is carried out by any suitable means, for example, rinsing the substrate with de-ionized water by immersion or spray techniques. In preferred embodiments, the rinsing step is carried out employing a mixture of de-ionized water and a water-miscible organic solvent such as, for example, isopropyl alcohol.

The drying step is carried out by any suitable means, for example, isopropyl alcohol (IPA) vapor drying or by centripetal force.

It will be appreciated by those skilled in the art that the cleaning composition of the present invention may be modified to achieve optimum cleaning without damaging the substrate so that high throughput cleaning can be maintained in the manufacturing process. For example, one skilled in the art would appreciate that, for example, modifications to the amounts of some or all of the components may be made depending upon the composition of the substrate being cleaned, the nature of the residue to be removed, and the particular process parameters used.

Although the present invention has been principally described in connection with cleaning semiconductor substrates, the cleaning compositions of the invention can be employed to clean any substrate that includes organic and inorganic residues.

The following examples are provided for the purpose of further illustrating the present invention but are by no means intended to limit the same.

EXAMPLES

The formulations in Table 1 below were made by mixing and blending components on a recipe (please refer to recipe table above), and stirred at room temperature. Metal etch rates were measured in a beaker with 1" Teflon stirbar at 500 rpm on a hotplate that heats up the solution to temperature between 35 and 50 degree C. Blanket wafers of metals (Cu or Co on silicon wafer) were used for etch rate measurement, with ResMap 4-point probe. The thickness of metal blankets were measured before and after the chemical dipping, and division of film loss by process time (minutes) gives metal etch rates in angstrom per minute.

TABLE 1

| | 88G | 98H | 98i | 98J | 98K | 98Q | 98R | 98S | 98T | 98EE | 98NN | 98OO | 98PP | 98QQ | 98RR | 98SS | 98TT | 98UU |
|---|---|---|---|---|---|---|---|---|---|---|---|---|---|---|---|---|---|---|
| D/W | 10.3 | 11.3 | 13.3 | 11.2 | 9.8 | 9.4 | 9.3 | 10.1 | 9.7 | 10.2 | 9.3 | 9.3 | 9.3 | 9.3 | 9.4 | 9.5 | 8.5 | 8.6 |
| PG | 40.0 | 40.0 | 40.0 | 40.0 | 40.0 | 40.0 | 40.0 | 40.0 | 40.0 | 40.0 | 40.0 | 40.0 | 40.0 | 40.0 | 40.0 | 40.0 | 40.0 | 40.0 |
| Benzyl alcohol | | | | | | | | | | | | | | | | | | |
| Ancamine 2726 | | | | | | | | | | | | | | | | | | |
| Citric acid (29%) | 6.1 | 5.2 | | 3.2 | 5.3 | 5.9 | 6.1 | 5.2 | 5.8 | 6.0 | 5.3 | 5.3 | 5.3 | 5.3 | 5.3 | 5.3 | 5.3 | 5.3 |
| EDTA | | | 2.1 | 1.0 | 0.3 | 0.1 | 0.1 | 0.3 | 0.1 | 0.3 | 0.3 | 0.3 | 0.3 | 0.3 | 0.3 | 0.3 | 0.3 | 0.3 |
| PEI Mw = 600 (EPOMIN) | 1.5 | | | | | | | | | | | | | | | | | |
| Triethylenetetramine | | | | | | | | | | | 2.8 | 2.8 | 2.8 | 2.8 | 2.8 | 2.8 | 2.8 | 2.8 |
| Ancamine 2655 | | 1.0 | 2.4 | 2.4 | 2.4 | 2.4 | 2.4 | 2.4 | 2.4 | 3.9 | | | | | | | | |
| Triethanolamine | 25.0 | 25.0 | 25.0 | 25.0 | 25.0 | 25.0 | 25.0 | 25.0 | 25.0 | 22.5 | 25.0 | 25.0 | 25.0 | 25.0 | 25.0 | 25.0 | 24.6 | 24.6 |
| TEAH 35% | | | | | | | | | | | | | | | | | 1.2 | 1.2 |

TABLE 1-continued

|  | 88G | 98H | 98i | 98J | 98K | 98Q | 98R | 98S | 98T | 98EE | 98NN | 98OO | 98PP | 98QQ | 98RR | 98SS | 98TT | 98UU |
|---|---|---|---|---|---|---|---|---|---|---|---|---|---|---|---|---|---|---|
| HF5% | 17.0 | 17.0 | 17.0 | 17.0 | 17.0 | 17.0 | 17.0 | 17.0 | 17.0 | 17.0 | 17.0 | 17.0 | 17.0 | 17.0 | 17.0 | 17.0 | 17.0 | 17.0 |
| TTL (Estimated pH) | 0.1 |  | 0.3 | 0.3 | 0.3 | 0.3 | 0.3 | 0.1 | 0.1 | 0.1 | 0.3 | 0.3 | 0.3 | 0.3 | 0.2 | 0.1 | 0.3 | 0.2 |
| Cu (0-30) e/r [A/min] | 0.2 | 1.1 | −0.1 | −0.1 | −0.1 | 0.0 | 0.3 | 0.3 | 0.0 | 0.3 | 0.9 | −0.6 | 0.1 | −0.1 | 0.3 | 0.2 | 0.3 | 0.4 |
| CuOx e/r [A/min] | 1.9 | 12.3 | 3.4 | 2.3 | 3.1 | 1.2 | 1.4 | 0.6 | 2.3 | 0.1 | 0.2 | 0.4 | 0.4 | 0.3 | −1.2 | −0.6 | −0.2 | 0.9 |
| Co e/r [A/min] | 8.0 | 12.0 | 2.2 | 3.4 | 2.6 | 7.9 | 15.1 | 19.4 | 8.5 | 4.7 | 4.3 | 4.5 | 5.1 | 3.8 | 6.3 | 5.8 | 6.4 | 5.7 |
| TaOx e/r [A/min] |  | −0.1 | −0.1 | 0.0 | 0.1 | 0.0 | 0.1 | 0.1 | 0.1 | −0.1 | 0.1 | 0.1 | 0.0 | 0.0 | 0.1 | 0.1 | 0.0 | −0.2 |

The data in Table 1 illustrates that an amount of ethylenediaminetetraacetic acid (EDTA) of at least 0.3% and, in particular from 0.3 to 3.0%, when added to a wafer cleaning formulation comprising other components including organic acid, amine, fluoride, water and organic solvent, the effect of Co corrosion inhibition by EDTA was observed. This is especially true when at least 0.3% of an additional corrosion inhibitor such as, for example, tolyltriazole (TTL) is present in the formulation (cf. 98K with 98S). The data above suggests that if the amount of EDTA % is below 0.3% the Co corrosion inhibition is not sufficient.

While the principles of the invention have been described above in connection with preferred embodiments, it is to be clearly understood that this description is made only by way of example and not as a limitation of the scope of the invention.

The invention claimed is:

1. A composition useful for removing residue from a semiconductor substrate consisting of, in effective cleaning amounts:
   from about 0.3 to about 5.0% by weight of EDTA;
   from about 10.0 to about 30.0% by weight of an amine compound wherein the amine compound is selected from the group consisting of a secondary amine, a tertiary amine, and mixtures thereof;
   from about 0.1 to about 5.0% by weight of a polyfunctional organic acid;
   from about 0.01 to about 8.0% by weight of a fluoride ion source selected from the group consisting of ammonium fluoride, a quaternary ammonium fluoride, and a fluoride salt of an aliphatic primary, secondary or tertiary amine having the formula:

$R^1NR^2R^3R^4F$ wherein $R^1$, $R^2$, $R^3$ and $R^4$ each individually represent H or a ($C_1$-$C_4$) alkyl group;
   from about 0 to about 60% by weight of a water-miscible organic solvent;
   from about 0 to about 15% by weight of a corrosion inhibitor; and
   remainder is water.

2. The composition of claim 1 wherein the amine compound is selected from the group consisting of triethanolamine (TEA), diethanolamine, N-methyl diethanolamine, diisopropanolamine, N-methyl ethanol amine, and mixtures thereof.

3. The composition of claim 1 wherein the polyfunctional organic acid is selected from the group consisting of malonic acid, malic acid, phthalic acid, citric acid, trimellitic acid, and combinations thereof.

4. The composition of claim 1 wherein the corrosion inhibitor is present and is a triazole compound.

5. The composition of claim 4 wherein the triazole compound is selected from the group consisting of benzotriazole, o-tolyltriazole, m-tolyltriazole, p-tolyltriazole, carboxybenzotriazole, 1-hydroxybenzotriazole, nitrobenzotriazole, and dihydroxypropylbenzotriazole.

6. The composition of claim 5 wherein the triazole compound is selected from the group consisting of o-tolyltriazole, m-tolyltriazole, p-tolyltriazole, and mixtures thereof.

7. The composition of claim 1 wherein the water-miscible organic solvent is present and is selected from the group consisting of dimethylacetamide (DMAC), N-methyl pyrrolidinone (NMP), dimethylsulfoxide (DMSO), dimethylformamide, N-methylformamide, formamide, dimethyl-2-piperidone (DMPD), tetrahydrofurfuryl alcohol, glycerol, ethylene glycol, an amide, an alcohol, a sulfoxide, a hydroxyamide, an amino alcohols, a ($C_2$-$C_{20}$) alkanediol, a ($C_3$-$C_{20}$) alkanetriol, a cyclic alcohol, propylene glycol, tetrahydrofurfuryl alcohol, diacetone alcohol, 1,4-cyclohexanedimethanol.

8. The composition of claim 7 wherein the water-miscible organic solvent is selected from the group consisting of DMSO, NMP, and DMAC.

9. The composition of claim 1 wherein the water-miscible organic solvent is present and is a glycol ether selected from the group consisting of ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monoethyl ether acetate, propylene glycol methyl ether acetate, propylene glycol monomethyl ether, propylene glycol dimethyl ether, propylene glycol monobutyl ether, propylene glycol, monopropyl ether, dipropylene glycol monomethyl ether, dipropylene glycol monopropyl ether, dipropylene glycol monoisopropyl ether, dipropylene monobutyl ether, dipropylene glycol diisopropyl ether, tripropylene glycol monomethyl ether, 1-methoxy-2-butanol, 2-methoxy-1-butanol, 2-methoxy-2-methylbutanol, 1,1-dimethoxyethane, and 2-(2-butoxyethoxy) ethanol.

10. The composition of claim 1 consisting essentially of:
   from about 0.3 to about 3.5% by weight of EDTA;
   from about 20.0 to about 30.0% by weight of an amine compound wherein the amine compound is selected from the group consisting of a secondary amine, a tertiary amine, and mixtures thereof;
   from about 0.5 to about 2.0% by weight of a polyfunctional organic acid;
   from about 0.025 to about 5.0% by weight of a fluoride ion source selected from the group consisting of ammonium fluoride, a quaternary ammonium fluoride, and a fluoride salt of an aliphatic primary, secondary or tertiary amine having the formula:

$$R^1NR^2R^3R^4F$$

wherein $R^1$, $R^2$, $R^3$ and $R^4$ each individually represent H or a ($C_1$-$C_4$) alkyl group;
from about 20 to about 40% by weight of a water-miscible organic solvent; and
from about 0.3 to about 1.5% by weight of a corrosion inhibitor selected from the group consisting of o-tolyltriazole, m-tolyltriazole, p-tolyltriazole, and mixtures thereof.

11. A method for removing residue from a substrate optionally comprising aluminum, the method comprising the steps of:
contacting the substrate at a temperature of from about 25° C. to about 85° C. for a period of time ranging from about 1 minute to about 1 hour with a composition consisting of:
from about 0.3 to about 5.0% by weight of EDTA;
from about 10.0 to about 30.0% by weight of an amine compound wherein the amine compound is selected from the group consisting of a secondary amine, a tertiary amine, and mixtures thereof;
from about 0.1 to about 5.0% by weight of a polyfunctional organic acid;
from about 0.01 to about 8.0% by weight of a fluoride ion source selected from the group consisting of ammonium fluoride, a quaternary ammonium fluoride, and a fluoride salt of an aliphatic primary, secondary or tertiary amine having the formula:

$$R^1NR^2R^3R^4F$$

wherein $R^1$, $R^2$, $R^3$ and $R^4$ each individually represent H or a ($C_1$-$C_4$) alkyl group;
from about 0 to about 60% by weight of a water-miscible organic solvent;
from about 0 to about 15% by weight of a corrosion inhibitor; and
remainder water;
rinsing the substrate with water; and
drying the substrate, wherein the method excludes an intermediate IPA rinse step prior to the step of rinsing the substrate with water.

12. The method of claim 11 wherein the substrate is a semiconductor substrate.

13. The method of claim 11 wherein the amine compound is selected from the group consisting of triethanolamine (TEA), diethanolamine, N-methyl diethanolamine, diisopropanolamine, N-methyl ethanol amine, and mixtures thereof.

14. The method of claim 11 wherein the polyfunctional organic acid is selected from the group consisting of malonic acid, malic acid, phthalic acid, citric acid, trimellitic acid, and combinations thereof.

15. The method of claim 11 wherein the corrosion inhibitor is present and is a triazole compound.

16. The method of claim 15 wherein the triazole compound is selected from the group consisting of benzotriazole, o-tolyltriazole, m-tolyltriazole, p-tolyltriazole, carboxybenzotriazole, 1-hydroxybenzotriazole, nitrobenzotriazole, and dihydroxypropylbenzotriazole.

17. The method of claim 16 wherein the triazole compound is selected from the group consisting of o-tolyltriazole, m-tolyltriazole, p-tolyltriazole, and mixtures thereof.

18. The method of claim 11 wherein the water-miscible organic solvent is present and is selected from the group consisting of dimethylacetamide (DMAC), N-methyl pyrrolidinone (NMP), dimethylsulfoxide (DMSO), dimethylformamide, N-methylformamide, formamide, dimethyl-2-piperidone (DMPD), tetrahydrofurfuryl alcohol, glycerol, ethylene glycol, an amide, an alcohol, a sulfoxide, a hydroxyamide, an amino alcohols, a ($C_2$-$C_{20}$) alkanediol, a ($C_3$-$C_{20}$) alkanetriol, a cyclic alcohol, propylene glycol, tetrahydrofurfuryl alcohol, diacetone alcohol, 1,4-cyclohexanedimethanol.

19. The method of claim 18 wherein the water-miscible organic solvent is selected from the group consisting of DMSO, NMP, and DMAC.

20. The method of claim 11 wherein the water-miscible organic solvent is present and is a glycol ether selected from the group consisting of ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monthly ether acetate, propylene glycol methyl ether acetate, propylene glycol monomethyl ether, propylene glycol dimethyl ether, propylene glycol monobutyl ether, propylene glycol, monopropyl ether, dipropylene glycol monomethyl ether, dipropylene glycol monopropyl ether, dipropylene glycol monoisopropyl ether, dipropylene monobutyl ether, dipropylene glycol diisopropyl ether, tripropylene glycol monomethyl ether, 1-methoxy-2-butanol, 2-methoxy-1-butanol, 2-methoxy-2-methylbutanol, 1,1-dimethoxyethane, and 2-(2-butoxyethoxy) ethanol.

21. The method of claim 11 wherein the composition consists of:
from about 0.3 to about 3.5% by weight of EDTA;
from about 20.0 to about 30.0% by weight of an amine compound wherein the amine compound is selected from the group consisting of a secondary amine, a tertiary amine, and mixtures thereof;
from about 0.5 to about 2.0% by weight of a polyfunctional organic acid;
from about 0.025 to about 5.0% by weight of a fluoride ion source selected from the group consisting of ammonium fluoride, a quaternary ammonium fluoride, and a fluoride salt of an aliphatic primary, secondary or tertiary amine having the formula:

$$R^1NR^2R^3R^4F$$

wherein $R^1$, $R^2$, $R^3$ and $R^4$ each individually represent H or a ($C_1$-$C_4$) alkyl group;
from about 20 to about 40% by weight of a water-miscible organic solvent; and
from about 0.3 to about 1.5% by weight of a corrosion inhibitor selected from the group consisting of o-tolyltriazole, m-tolyltriazole, p-tolyltriazole, and mixtures thereof.

22. The method of claim 12 where the substrate comprises cobalt metal and aluminum.

23. The method of claim 22 wherein the composition protects the cobalt metal by providing a cobalt metal etch rate of 4 Å/min or less.

24. The method of claim 23 wherein the composition protects the cobalt metal by providing a cobalt metal etch rate of 3 Å/min or less.

25. The method of claim 24 wherein the composition protects the cobalt metal by providing a cobalt metal etch rate of 2 Å/min or less.

* * * * *